United States Patent [19]

Sasaki et al.

[11] Patent Number: 4,849,727

[45] Date of Patent: Jul. 18, 1989

[54] MAGNETIC SHIELD FOR A MAGNETIC RESONANCE MAGNET

[75] Inventors: Katutoki Sasaki, Yokohama; Hirotsugu Ohguma, Tokyo; Kinya Matsutani, Yokohama, all of Japan

[73] Assignee: Kabushiki Kaisha Toshiba, Kawasaki, Japan

[21] Appl. No.: 119,048

[22] Filed: Nov. 10, 1987

[30] Foreign Application Priority Data

Nov. 13, 1986 [JP] Japan .................. 61-268704
May 29, 1987 [JP] Japan .................. 62-133776

[51] Int. Cl.⁴ .................................. H01K 7/00
[52] U.S. Cl. .......................... 335/301; 324/318
[58] Field of Search ............ 335/214, 299, 301, 304; 324/318, 319, 320, 321

[56] References Cited

U.S. PATENT DOCUMENTS

| | | | |
|---|---|---|---|
| 3,437,963 | 4/1969 | Gang et al. | 335/301 X |
| 4,590,452 | 5/1986 | Ries et al. | 335/301 |
| 4,635,017 | 1/1987 | Ries | 335/301 |
| 4,646,045 | 2/1987 | Chari et al. | 335/301 |
| 4,727,328 | 2/1988 | Carper et al. | 324/318 |
| 4,748,414 | 5/1988 | Knuttel et al. | 324/318 |

FOREIGN PATENT DOCUMENTS

| | | |
|---|---|---|
| 0139308 | 5/1984 | European Pat. Off. . |
| 0146267 | 11/1984 | European Pat. Off. . |
| 61-252613 | 11/1986 | Japan . |
| 1269052 | 6/1968 | United Kingdom . |
| 1379843 | 10/1971 | United Kingdom . |

OTHER PUBLICATIONS

Journal of NMR Medicine, vol. 6, Supplement-1, (1986).

Primary Examiner—George Harris
Attorney, Agent, or Firm—Foley & Lardner, Schwartz, Jeffery, Schwaab, Mack, Blumenthal & Evans

[57] ABSTRACT

A magnetic shield for a magnetic resonance magnet, the shield being made of magnetic material, surrounding the magnetic resonance magnet, the shield having at least two units which are so constructed as to be assembled with essentially horizontal movements of the units.

29 Claims, 5 Drawing Sheets

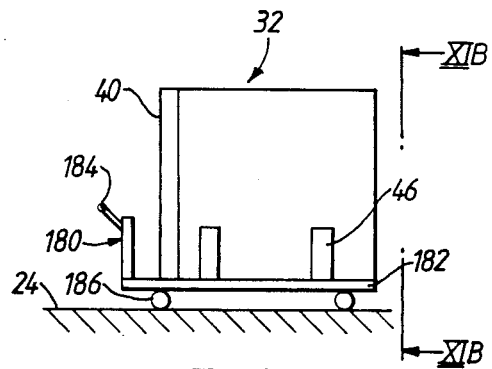
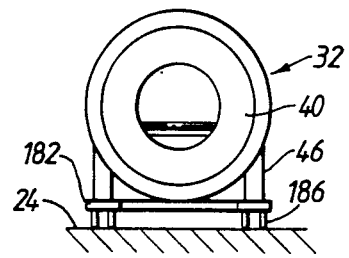
Fig.11(a).  Fig.11(b).
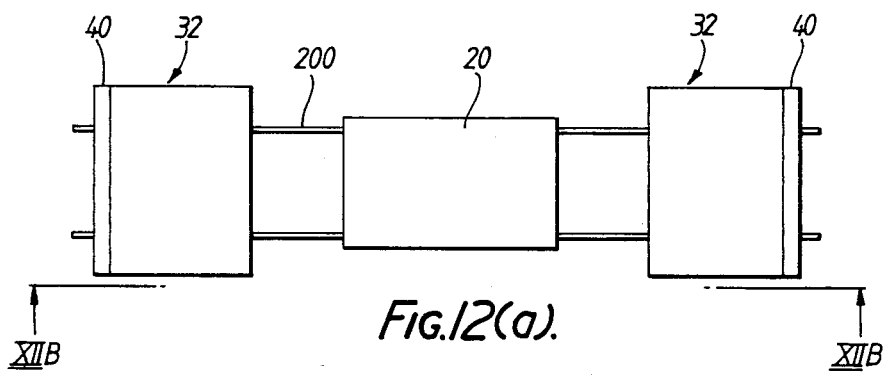
Fig.12(a).
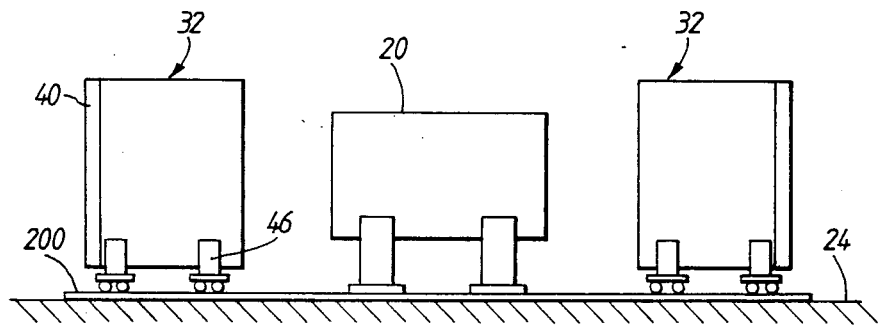
Fig.12(b).

MAGNETIC SHIELD FOR A MAGNETIC RESONANCE MAGNET

BACKGROUND OF THE INVENTION

1. Field of the Invention

This invention relates to a shield for reducing the stray magnetic field in the vicinity of a magnetic resonance (MR) magnet.

2. Description of the Prior Art

An MR imaging device using an MR magnet is utilized in medical diagnostics in hospitals. The MR magnet generates a high intensity magnetic field. The disturbance to other hospital equipment due to the magnetic field generated by the MR magnet should be as low as possible. In order to reduce the intensity of the magnetic field outside the MR device, a magnetic shield is provided. The magnetic shield is also effective to generate a uniform magnetic field in the magnet working volume negating the effect of the surrounding structural elements.

Japanese Patent Disclosure (Kokai) No. 61-252613 and U.S. Pat. No. 4,646,045 disclose a magnetic shield for an MR magnet wherein a magnetic shield is provided in the form of a cylindrical shell of magnetic material surrounding the MR magnet. The cylindrical shell is situated so that its longitudinal axis is coaxial with the magnetic axis of the magnet. The cylindrical shell is fabricated with a number of staves. Two disk shape end caps of magnetic material are secured to either end of the cylindrical shell. The end caps each have a central aperture.

A magnetic shield, typically described above, with an MR magnet is a heavy object, generally weighing as much as 20 tons. However, the maximum loading for passageway floors in hospitals is generally no more than 10 tons. This makes it impossible to transport the MR magnet and its associated magnetic shield into the hospital room as a single unit. In the case of the conventional device described above, the method adopted is that the staves and the end caps are removed from the MR magnet and conveyed into the hospital individually for later assembly in the MR imaging device room in the hospital.

However, the room where the MR imaging device is installed is simply an ordinary hospital room, and no apparatus, such as a crane, is generally available for lifting very heavy objects. The unavoidable implication here is that when the magnetic shield is assembled in the MR device room, all the work has to be done by human muscle-power. In the conventional device described above, each stave weighs about a hundred and forty or fifty kilograms, which makes it impossible for them to be lifted and assembled into the magnetic shield by human muscle-power alone. This leads to an inescapable drawback, namely, that basically a magnetic shield for the MR magnet cannot be installed in a room in an existing hospital building.

The present method of dealing with this situation is to erect a new building specially for the MR imaging device, and lower the device, with its magnetic shield, down into the building by means of a large mobile crane while the building itself is under construction. However, in this case, the cost of construction may exceed the cost of the device itself, so that the total cost is exceedingly high. High cost is a major drawback inhibiting the installation of MR imaging devices.

In the case of the conventional device, moreover, the staves have to be cut away at the positions of the service port and the legs. Since the magnetic flux passes inside the staves in the axial direction of the magnetic shield, this has the effect that a magnetic circuit is formed, with magnetic flux leaking temporarily into the space where the staves have been cut, and subsequently being absorbed into the neighboring staves. The drawback which results is a marked deterioration in magnetic shielding efficiency.

SUMMARY OF THE INVENTION

An object of the invention is to provide an MR magnet magnetic shield which can be easily assembled and installed even in a hospital room without a crane.

Another object of the invention is to provide a method of easily installing a magnetic shield for an MR magnet.

According to the invention there is provided a magnetic shield for a magnetic resonance magnet, the shield being made essentially of magnetic material, surrounding the magnetic resonance magnet, the shield having at least two units which are so constructed as to be assembled for surrounding the magnetic resonance magnet with essentially horizontal movements of the units.

According to another aspect of the invention there is provided a method of installing a magnetic-resonance with a magnetic shield, the method comprising the steps of: putting a magnetic resonance magnet on a horizontal floor; putting a plurality of units of a magnetic shield on the floor; and assembling a magnetic shield with essentially horizontal movements of the units to surround the magnetic resonance magnet.

Further objects, features and advantages of the present invention will become apparent from the detailed description of the preferred embodiments that follow, when considered with the attached drawings.

BRIEF DESCRIPTION OF THE DRAWINGS

The accompanying drawings, which are incorporated in and constitute a part of this specification, illustrate embodiments of the invention and together with the description, serve to explain the principles of the invention. In the drawings:

FIG. 11(a) is an elevational view of the carrier shown in FIGS. 10(a), 10(b) and 10(c) loaded with a unit of the magnetic shield shown in FIGS. 1 and 2; FIG. 11(b) is a view taken along line XIB—XIB of FIG. 11(a);

FIG. 12(a) is a plan view of the magnetic shield shown in FIGS. 1 and 2, selectively provided with a rail; 12(b) is a view taken along line XIIB—XIIB of FIG. 12(a).

DETAILED DESCRIPTION OF THE PREFERRED EMBODIMENTS

Figure 1:
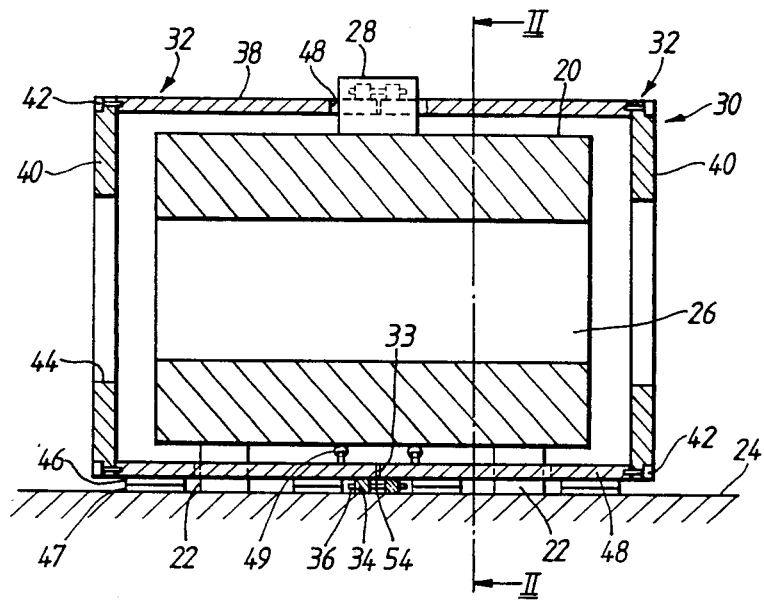
FIG. 1 is a longitudinal cross-sectional view of a first embodiment of this invention.
Figure 2:
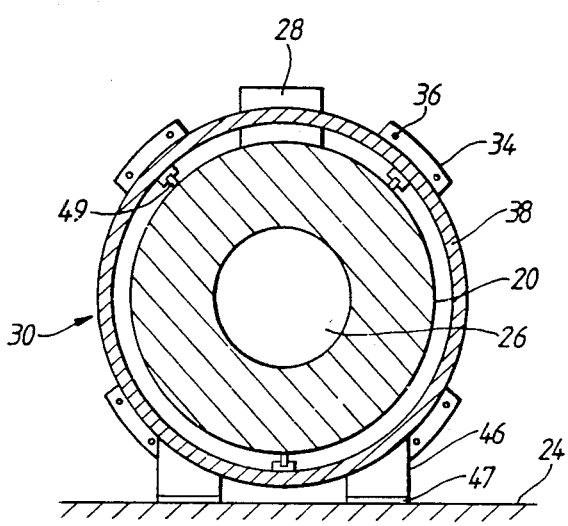
FIG. 2 is a cross-sectional view taken along line II—II of FIG. 1.

A first embodiment of the invention will now be described, referring to FIGS. 1 and 2. An MR magnet 20 has magnet legs 22 and is set on a horizontal flat floor 24 with its axis in a horizontal direction. The magnet 20 has a magnet working volume 26 in which a patient is placed to be diagnosed. There is provided a service port 28 in the central part of the top of the magnet 20, through which coolant such as liquid helium is supplied to maintain the coil (not shown) of the MR magnet 20 in a superconductive state.

A magnetic shield 30 is set to surround the MR magnet 20. The shield 30 consists of two identical units 32 which meet at flat surfaces 33 and are combined by central flanges 34 and assembling bolts 36. The flat surfaces 33 are mechanically finished to provide good contact without a gap therebetween. Each of the units 32 has a cylindrical shell 38 which coaxially surrounds part of the MR magnet 20. End plates 40 are attached with end bolts 42 on the further ends of the cylindrical shells 38 away from the central flanges 34, thereby covering both ends of the MR magnet 20. The end plates 40 have circular bores 44 for patient access to the magnet working volume 26 in the MR magnet 20. Bores 44 are coaxial with the MR magnet 20. The cylindrical shells 38 and the end plates 40 are made of magnetic material.

The cylindrical shells 38 are provided with shield legs 46 to support the shield 30 on the floor 24. A leg base 47 is selectively provided under the bottom of each shield leg 46 to adjust the height of the shield 30. The cylindrical shells 38 have notches 48 to accommodate the projecting parts of the MR magnet 20, such as the service port 28 and the magnet legs 22.

Small rubber wheels 49 are provided on the inner surface of the cylindrical shells 38 abutting the MR magnet 20. The wheels 49 help the units 32 move smoothly in an axial direction relative to the magnet 20.

Figure 3:
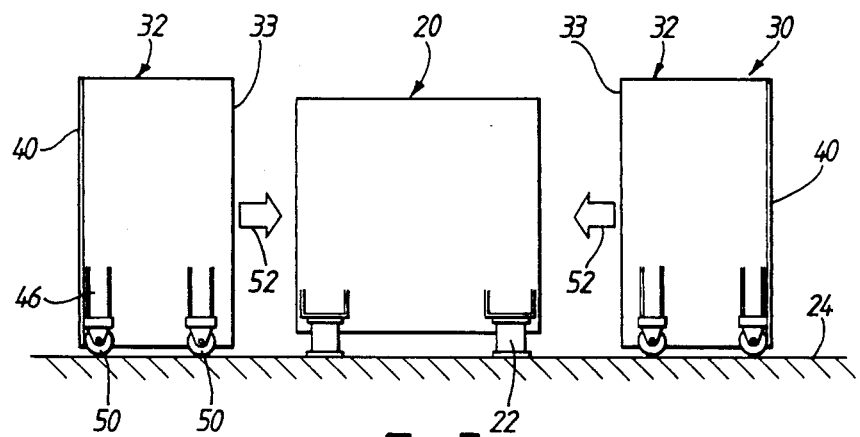
FIG. 3 is an elevational view of the first embodiment as being assembled.

Installation of the MR magnet 20 and the magnetic shield 30 is illustrated in FIG. 3. The MR magnet 20 is first set on the floor 24 of a room in a hospital. Then, the two units 32 of the magnetic shield 30 are put on the floor 24. Casters 50 are selectively fixed to the bottom of the shield legs 46 at this time. The units 32 can be easily moved on the floor 24 without using any major transportation device owing to the casters 50. The units 32 are moved horizontally as shown by arrows 52 in FIG. 3 to meet each other at the flat surfaces 33 thereby surrounding the MR magnet 20. Then the central flanges 34 are combined with the assembling bolts 36. After the combining is completed, the casters 50 are removed and the leg bases 47 are installed under the shield legs 46, as shown in FIGS. 1 and 2.

In that installing operation, only a jack (not shown) which can be used even in a hospital room is required. Cranes are not required at any stage. The jack is utilized to lift each section 32 for installation and removal of the casters and finally for installation of the leg bases 47.

Since the cylindrical shells 38 are formed as a cylindrical surface enclosing the MR magnet 20, instead of an assembly of parallel staves, magnetic paths are continuously formed in the magnetic shield at the notches 48. Therefore, the magnetic shield effect is improved.

Since the two units 32 meet at flat surfaces 33, they can be easily combined without gaps which would increase magnetic resistance.

The assembling bolts 36 may include reamer bolts or knock pins, so as to make the positioning of the two units 32 easy. A contact member 54 of magnetic material having rubber elasticity or plasticity may be inserted between the flat surfaces 33 to get better magnetic contacts. The contact member 54 may be a plate of magnetic material with an adhesive layer.

Figure 4A:
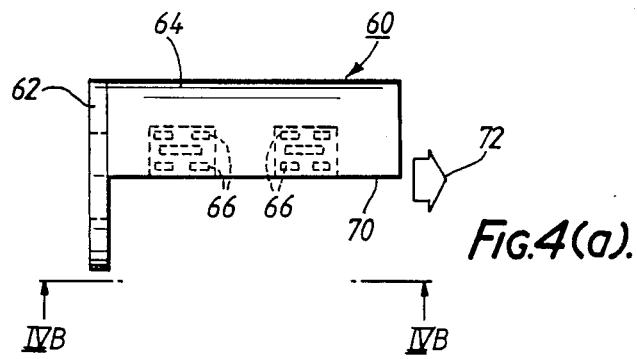
FIG. 4(a) is a plan view of a second embodiment of the invention.
Figure 4B:
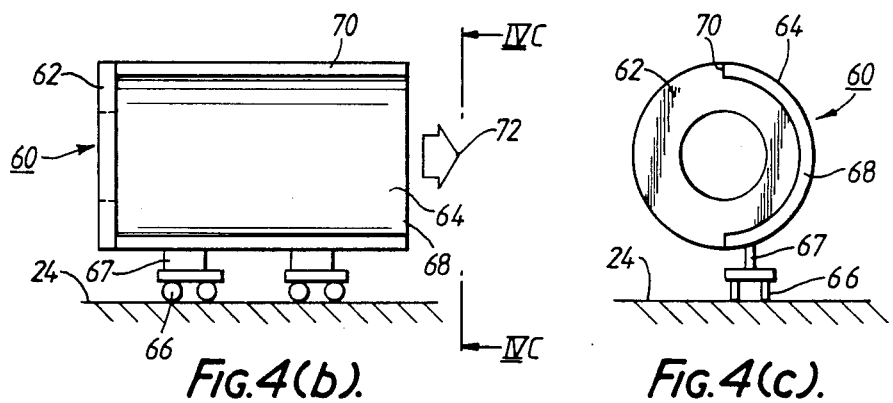
FIG. 4(b) is a view taken along line IVB—IVB of FIG. 4(a)
Figure 4C:
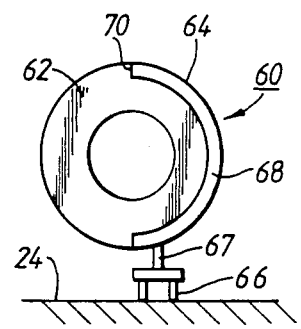
FIG. 4(c) is a view taken along line IVC—IVC of FIG. 4(b)
Figures 5A, 5B:
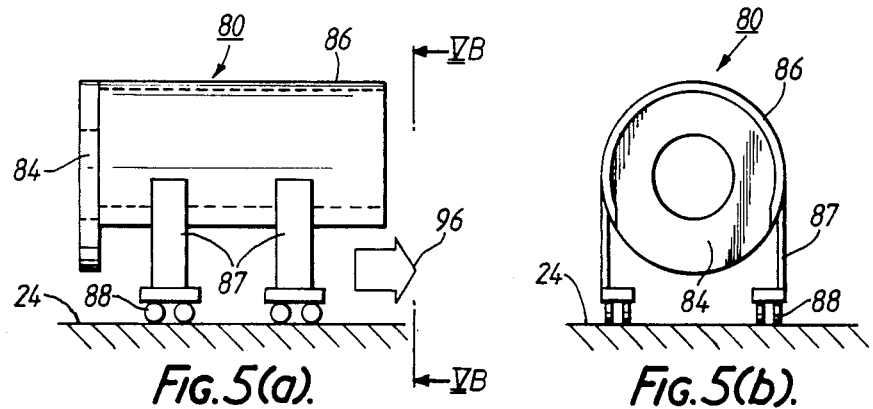
FIG. 5(a) is an elevational view of a first unit of a third embodiment of the invention.
FIG. 5(b) is a view taken along line VB—VB of FIG. 5(a)
Figures 6A, 6B:
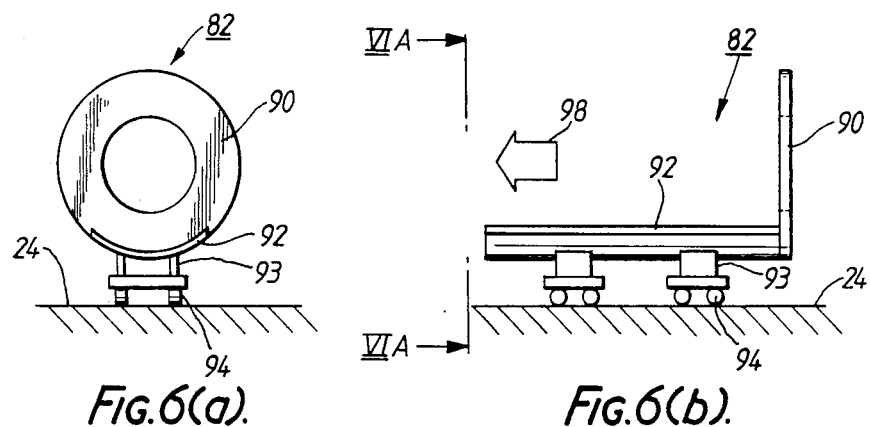
FIG. 6(a) is a view taken along line VIA—VIA of FIG. 6(b)
FIG. 6(b) is an elevation view of a second unit of the third embodiment.

Referring to FIGS. 4(a), 4(b) and 4(c), a second embodiment of the invention will now be described. The magnetic shell is assembled from two units which are symmetric with each other. One of the units 60 is shown in the drawings. The unit 60 has an end plate 62 and a semi-cylindrical shell 64 which is provided with casters 66 under the shield legs 67 for moving on the floor 24. The semi-cylindrical shell 64 has a horizontal axis, and is shaped in the form of a cylinder divided by a longitudinal vertical flat plane to form a semi-cylindrical shell. A vertical flat surface 68 on the further end of the semi-cylindrical shell 64 away from the end plate 62 meets the end plate of the other unit (not shown) when the unit 60 is moved in the axial direction shown as an arrow 72. A longitudinal vertical flat surface 70 of the semi-cylindrical shell 64 meets the counterpart surface of the other unit (not shown).

Referring to FIGS. 5(a), 5(b), 6(a) and 6(b), a third embodiment of the invention will now be described. The magnetic shield is fabricated with a first unit 80 shown in FIGS. 5(a) and 5(b) and a second unit 82 shown in FIGS. 6(a) and 6(b). The first unit 80 has a first end plate 84 and an upper shell 86. The upper shell 86 has upper-shell legs 87, and the upper-shell legs 87 are provided with casters 88 for moving on the floor 24. The second unit 82 has a second end plate 90 and a lower shell 92. The lower shell 92 has lower-shell legs 93, and the lower-shell legs are provided with casters 94 for moving on the floor 24. The first unit 80 and the second unit 82 are moved in the axial directions shown by arrows 96 and 98, respectively, and combined together to surround the MR magnet 20 (not shown in FIGS. 5(a), 5(b), 6(a) or 6(b)).

Figure 7:
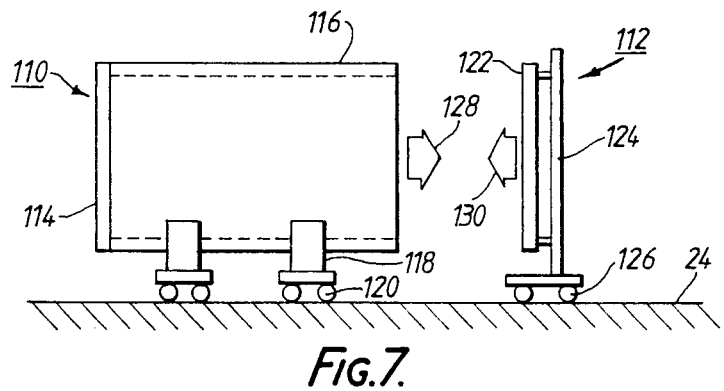
FIG. 7 is an elevational view of a fourth embodiment of the invention as being assembled.

Referring to FIG. 7, a fourth embodiment of the invention will now be described. The magnetic shield is fabricated with a first unit 110 and a second unit 112. The first unit 110 has a first end plate 114 and a cylindrical shell 116. The cylindrical shell 116 is supported by shield legs 118, and the shield legs 118 are provided with casters 120.

The second unit 112 has a second end plate 122 which is to meet the cylindrical shell 116 at the further end from the first end plate 114. The second end plate 122 is supported by an end plate support 124 which is provided with casters 126. The first unit 110 and the second unit 112 are moved in the axial directions shown by arrows 128 and 130, respectively, to be assembled.

Figure 8:
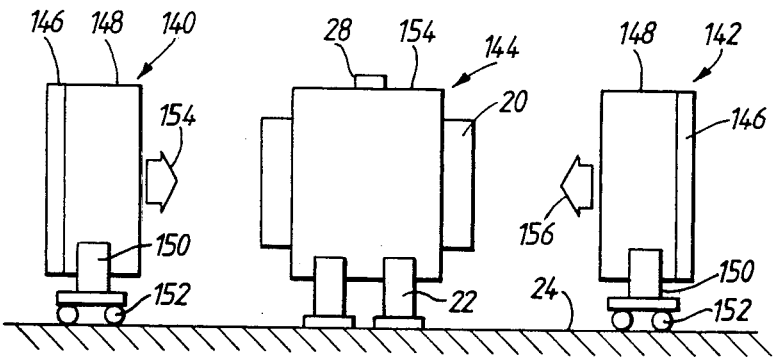
FIG. 8 is an elevational view of a fifth embodiment of the invention as being assembled.

Referring to FIG. 8, a fifth embodiment of the invention will now be described. The magnetic shield is fabricated from first, second and third units 140, 142 and 144, respectively. The first and second units 140 and 142 are formed identical, and each has an end plate 146 and an axially positioned cylindrical shell 148 adjacent to the end plate 146. Cylindrical shell 148 is supported by shield legs 150 which are provided with casters 152.

The third unit 144 has an axially central cylindrical shell 154. The third unit 144 is assembled with the MR magnet in the factory, carried together and set on the floor 24 in a hospital.

The first and second units 140 and 142 are carried on the floor 24 with the casters 152 in axial directions of arrows 154 and 156, respectively, shown in FIG. 8.

The MR magnet 20 has projections, such as the magnet legs 22 and the service port 28. Notches have to be provided in the axially central part of the shield to accommodate these projections which makes its construction complex. However, for this embodiment, this complex part is pre-fabricated, and the on-site assembly is easy.

Figure 9:
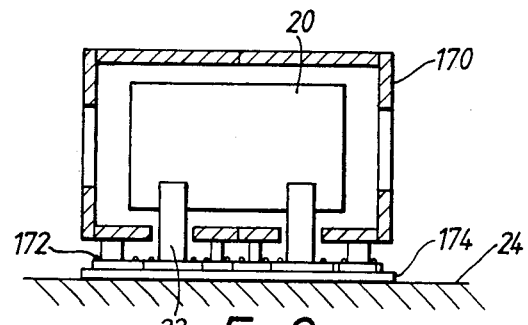
FIG. 9 is a longitudinal cross-sectional view of a sixth embodiment of the invention.

As for a sixth embodiment of the invention, the MR magnet 20 and the units of the magnetic shield 170 may be fixed by bolts 172 on a common base 174 set on the floor 24, as shown in FIG. 9.

Figure 10A:
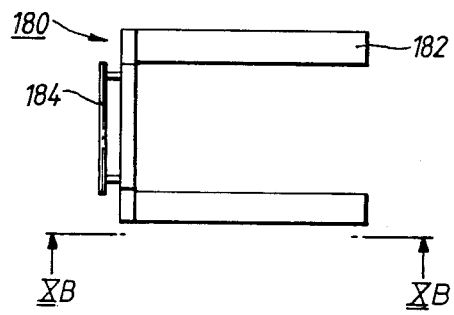
FIG. 10(a) is a plan view of a carrier.
Figure 10B:
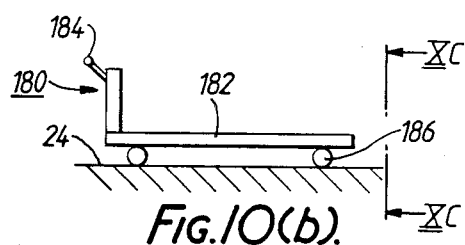
FIG. 10(b) is a view taken along line XB—XB of FIG. 10(a)
Figure 10C:
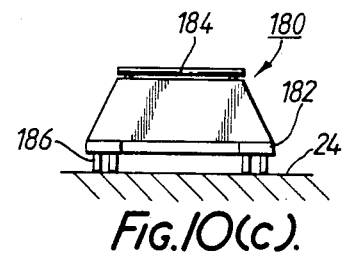
FIG. 10(c) is a view taken along line XC—XC of FIG. 10(b)

The means by which the units of the magnetic shield are moved need not be casters attached to shield legs. The units can be loaded onto an auxiliary conveyance, such as a carrier 180 shown in FIGS. 10(a), 10(b) and 10(c). The carrier 180 has a frame 182 and a handle 184, and casters 186 are provided under the frame 182. The unit 32 shown in FIGS. 1 and 2 is put on the frame 182 as shown in FIGS. 11(a) and 11(b). The carrier 180 with the unit 32 can be moved on the floor 24 by pushing the handle 184.

The units 32 of magnetic shield may be moved on rails 200 which are set on the floor 24 in the axial direction of the MR magnet 20, as shown in FIGS. 12(a) and 12(b). The units 32 can be moved smoothly on the rails 200, which makes it easy to position the units 32 and to assemble them.

The foregoing description has been set forth merely to illustrate preferred embodiments of the invention and is not intended to be limiting. Since modification of the described embodiments incorporating the spirit and substance of the invention may occur to persons skilled in the art, the scope of the invention should be limited solely with respect to the appended claims and equivalents.

What is claimed is:

1. A magnetic shield for a magnetic resonance magnet, the magnetic resonance magnet being placed on an essentially horizontal floor and being used for medical diagnostics, the shield being made essentially of magnetic material, surrounding the magnetic resonance magnet, the shield having at least two units which are so constructed as to be assembled for surrounding said magnetic resonance magnet with essentially only horizontal movements of the units.

2. A magnetic shield according to claim 1, wherein:
the resonance magnet has a horizontal axis;
the shield comprises a cylindrical shell with two ends, the cylindrical shell being coaxial with the magnet; and
the shield further comprises two end plates each of which has a circular bore, coaxial with the magnet, one end plate attached on one end of the cylindrical shell and the other end plate attached on the other end of the cylindrical shell.

3. A magnetic shield according to claim 2, wherein said cylindrical shell has a substantially continuous cylindrical surface.

4. A magnetic shield according to claim 1 or 2, wherein each of the units has a flat surface where the units meet together when the units are assembled.

5. A magnetic shield according to claim 1 or 2, wherein the units are provided with detachable casters for moving the units.

6. A magnetic shield according to claim 2, herein two of said at least two units are of identical shape.

7. A magnetic shield according to claim 2, wherein two of said at least two units are of symmetric shapes.

8. A magnetic shield according to claims 2 or 3, wherein two of said at least two units each comprises one of the end plates and an axially partial part of the cylindrical shell adjacent to the end plate.

9. A magnetic shield according to claim 8, wherein each of the axially partial parts of the cylindrical shell has a flange for combining said axially partial parts together.

10. A magnetic shield according to claims 2 or 3, wherein said cylindrical shell comprises two semi-cylindrical parts, and two of said at least two units each comprises one of said end plates and one of said two semi-cylindrical parts.

11. A magnetic shield according to claims 2 or 3, wherein:
one of said at least two units comprises one of said end plates; and
another one of said at least two units comprises another one of said end plates and said cylindrical shell.

12. A magnetic shield according to claim 2 or 3, wherein:
said cylindrical shell comprises upper and lower cylindrical parts;
one of said at least two units comprises said upper cylindrical part and one of said end plates; and
another one of said at least two units comprises said lower cylindrical part and another one of said end plates.

13. A magnetic shield according to claims 2 or 3, wherein:
two of said at least two units each comprises one of said end plates and an adjacent axial part of said cylindrical shell; and
another one of said at least two units comprises an axial central part of said cylindrical shell.

14. A magnetic shield according to claim 2, further comprising means for guiding the units for assembly together.

15. A magnetic shield according to claim 14, wherein the guiding means comprises a horizontally fixed rail along which the units move.

16. A magnetic shield according to claim 14, wherein the guiding means comprises a wheel attached on the cylindrical shells abutting against the magnetic resonance magnet.

17. A magnetic shield according to claim 2, further comprises a contacting member between the units, the contacting member being made of flexible magnetic material for reducing surface magnetic resistance between the units.

18. A magnetic shield for a magnetic resonance magnet, the magnetic resonance magnet being placed on an essentially horizontal floor and being used for medical diagnostics, comprising:

(a) at least a first and second unit made of magnetic material, said first and second units effective, when assembled, for surrounding said magnetic resonance magnet;

(b) means for fixedly connecting together said first and second units for surrounding said magnetic resonance magnet; and (c) means for moving said first and second units only essentially horizontally for assembly surrounding said magnetic resonance magnet.

19. A magnetic shield as recited in claim 18 wherein:
the resonance magnet has a horizontal axis;
the shield comprises a cylindrical shell with two ends, the cylindrical shell being coaxial with the magnet; and
the shield further comprises two end plates each of which has a circular bore, coaxial with the magnet, one end plate attached on one end of the cylindrical shell and the other end plate attached on the other end of the cylindrical shell.

20. A magnetic shield as recited in claim 19, wherein said cylindrical shell has a substantially continuous cylindrical surface.

21. A method of installing a magnetic resonance magnet for medical diagnostics and a magnetic shield, the method comprising the steps of:
putting a magnetic resonance magnet on an essentially horizontal floor;
putting a plurality of units of a magnetic shield on said floor; and
subsequently, assembling a magnetic shield with essentially only horizontal movements of the units to surround the magnetic resonance magnet.

22. A magnetic shield for a magnetic resonance magnet, the shield being made essentially of magnetic material, surrounding the magnetic resonance magnet, the shield having at least two units which are so constructed as to be assembled for surrounding said magnetic resonance magnet with essentially only horizontal movements of the units, wherein the units are provided with detachable casters for moving the units.

23. A magnetic shield for a magnetic resonance magnet, the shield being made essentially of magnetic material, surrounding the magnetic resonance magnet, the shield having at least two units which are so constructed as to be assembled for surrounding said magnetic resonance magnet with essentially only horizontal movements of the units wherein:
the resonance magnet has a horizontal axis;
the shield comprises a cylindrical shell with two ends, the cylindrical shell being coaxial with the magnet;
the shield further comprises two end plates each of which has a circular bore, coaxial with the magnet, one end plate attached on one end of the cylindrical shell and the other end plate attached on the other end of the cylindrical shell; and
the units are provided with detachable casters for moving the units.

24. A magnetic shield for a magnetic resonance magnet, the shield being made essentially of magnetic material, surrounding the magnetic resonance magnet, the shield having at least two units which are so constructed as to be assembled for surrounding said magnetic resonance magnet with essentially only horizontal movements of the units wherein:
the resonance magnet has a horizontal axis;
the shield comprises a cylindrical shell with two ends, the cylindrical shell being coaxial with the magnet;
the shield further comprises two end plates each of which has a circular bore, coaxial with the magnet, one end attached on one end of the cylindrical shell and the other end plate attached on the other end of the cylindrical shell; and
said cylindrical shell comprises two semi-cylindrical parts, and two of said at least two units each comprises one of said end plates and one of said two semi-cylindrical parts.

25. A magnetic shield for a magnetic resonance magnet, the shield being made essentially of magnetic material, surrounding the magnetic resonance magnet, the shield having at least two units which are so constructed as to be assembled for surrounding said magnetic resonance magnet with essentially only horizontal movements of the units wherein:
the resonance magnet has a horizontal axis;
the shield comprises a cylindrical shell with two ends, the cylindrical shell being coaxial with the magnet;
the shield further comprises two end plates each of which has a circular bore, coaxial with the magnet, one end plate attached on one end of the cylindrical shell and the other end plate attached on the other end of the cylindrical shell;
said cylindrical shell has a substantially continuous cylindrical surface; and
said cylindrical shell comprises two semi-cylindrical parts, and two of said at least two units each comprises one of said end plates and one of said two semi-cylindrical parts.

26. A magnetic shield for a magnetic resonance magnet, the shield being made essentially of magnetic material, surrounding the magnetic resonance magnet, the shield having at least two units which are so constructed as to be assembled for surrounding said magnetic resonance magnet with essentially only horizontally movements of the units wherein:
the resonance magnet has a horizontal axis;
the shield comprises a cylindrical shell with two ends, the cylindrical shell being coaxial with the magnet;
the shield further comprises two end plates each of which has a circular bore, coaxial with the magnet, one end plate attached on one end of the cylindrical shell and the other end plate attached on the other end of the cylindrical shell;
said cylindrical shell comprises upper and lower cylindrical parts;
one of said at least two units comprises said upper cylindrical part and one of said end plates; and
another one of said at least two units comprises said lower cylindrical part and the other one of said end plates.

27. A magnetic shield for a magnetic resonance magnet, the shield being made essentially of magnetic material, surrounding the magnetic resonance magnet, the shield having at least two units which are so constructed as to be assembled for surrounding said magnetic resonance magnet with essentially only horizontal movements of the units wherein:
the resonance magnet has a horizontal axis;
the shield comprises a cylindrical shell with two ends, the cylindrical shell being coaxial with the magnet;
the shield further comprises two end plates each of which has a circular bore, coaxial with the magnet, one end plate attached on one end of the cylindrical shell and the other end plate attached on the other end of the cylindrical shell;

said cylindrical shell has a substantially continuous cylindrical surface;

said cylindrical shell comprises upper and lower cylindrical parts;

one of said at least two units comprises said upper cylindrical part and one of said end plates; and another one of said at least two units comprises said lower cylindrical part and the other one of said end plates.

28. A magnetic shield for a magnetic resonance magnet, the shield being made essentially of magnetic material, surrounding the magnetic resonance magnet, the shield having at least two units which are so constructed as to assembled for surrounding said magnetic resonance magnet with essentially only horizontal movements of the units wherein:

the resonance magnet has a horizontal axis;

the shield comprises a cylindrical shell with two ends, the cylindrical shell being coaxial with the magnet;

the shield further comprises two end plates each of which has a circular bore, coaxial with the magnet, one end plate attached on one end of the cylindrical shell and the other end plate attached on the other end of the cylindrical shell; and the shield further comprises guiding means for guiding the units for assembly together, wherein the guiding means comprising a horizontally fixed rail along which the units move.

29. A magnetic shield for a magnetic resonance magnet, the shield being made essentially of magnetic material, surrounding the magnetic resonance magnet, the shield having at least two units which are so constructed as to be assembled for surrounding said magnetic resonance magnet with essentially only horizontally movements of the units wherein:

the resonance magnet has a horizontal axis;

the shield comprises a cylindrical shell with two ends, the cylindrical shell being coaxial with the magnet;

the shield further comprises two end plates each of which has a circular bore, coaxial with the magnet, one end plate attached on one end of the cylindrical shell and the other end plate attached on the other end of the cylindrical shell; and the shield further comprises guiding means for guiding the units for assembly together, wherein the guiding means comprises a wheel attached on the cylindrical shells abutting against the magnetic resonance magnet.

* * * * *